United States Patent [19]
Heck et al.

[11] Patent Number: 5,898,912
[45] Date of Patent: Apr. 27, 1999

[54] DIRECT CURRENT (DC) OFFSET COMPENSATION METHOD AND APPARATUS

[75] Inventors: Joseph P. Heck, Fort Lauderdale; Robert E. Stengel, Pompano Beach, both of Fla.

[73] Assignee: Motorola, Inc., Schaumburg, Ill.

[21] Appl. No.: 08/673,857

[22] Filed: Jul. 1, 1996

[51] Int. Cl.$^6$ ................................ H04B 1/06; H04B 7/00
[52] U.S. Cl. .................................. 455/234.2; 455/226.1; 455/239.1
[58] Field of Search ........................ 455/232.1, 234.1, 455/234.2, 239.1, 246.1, 247.1, 324, 310, 317, 186.1, 126, 226.1, 67.4, 226.2; 375/345; 327/307, 309, 310, 311, 551

[56] References Cited

U.S. PATENT DOCUMENTS

| | | | |
|---|---|---|---|
| 5,054,116 | 10/1991 | Davidson | 455/126 |
| 5,086,437 | 2/1992 | Tomita | 375/98 |
| 5,140,699 | 8/1992 | Kozak | 455/84 |
| 5,389,839 | 2/1995 | Heck | 327/307 |
| 5,564,086 | 10/1996 | Cygan et al. | 455/126 |
| 5,590,418 | 12/1996 | Holoubek et al. | 455/126 |

*Primary Examiner*—Andrew I. Faile
*Assistant Examiner*—Christopher Onuaku
*Attorney, Agent, or Firm*—Val Jean F. Hillman

[57] ABSTRACT

A receiver (300) includes input ($I_{in}$), output ($V_{out}$), forward path with filter (104, and 108), and feedback path with error amplifier (112) coupled into the forward path. Coupled to the feedback path is an error signal storage device (408, 508). A control circuit (320) responsive to input signal amplitude couples to the storage device (408, 508) and retrieves stored error signal information for use by the feedback path. During calibration, a forward path stage is stimulated with a plurality of signals of known amplitude to generate outputs ($V_{out}$). The outputs are compared to a reference to generate error signals. Error signal values are stored in memory as a function of input signal amplitude. A plurality of error signal values are stored. During operation, stage input signals are detected and compared with the plurality of signals of known amplitude. Upon detection of a match, the error signal value associated with the signal of interest is retrieved from memory and employed during DC offset compensation.

5 Claims, 6 Drawing Sheets

DIRECT CURRENT (DC) OFFSET COMPENSATION METHOD AND APPARATUS

CROSS REFERENCE TO RELATED PATENTS

This application is related to U.S. Pat. No. 5,389,839, Heck, issued Feb. 14, 1995, entitled "Integratable DC Blocking Circuit," and assigned to Motorola, Inc.

FIELD OF THE INVENTION

This invention relates in general to Direct Current (DC) offset compensation circuits, and more particularly to, a DC offset compensation circuit which may be applied to, for example, a receiver in a radio communications device.

BACKGROUND OF THE INVENTION

FIG. 1 shows a block Diagram of a Direct Conversion receiver 10 as is known in the art. This Direct Conversion receiver 10 is extremely sensitive to problems typically associated with the existence of DC offset components in the baseband Intermediate Frequency (IF) output generated by the Direct Conversion receiver. These problems range from self interference to attack-time degradation. As will be appreciated, a major source of unwanted DC offset occurs when the Local Oscillator (LO) signal 20 applied to the down-mixing circuits 30 leaks into the radiofrequency (RF) input port 32 of the down-mixing circuits 30 and mixes with itself. Assuming this DC offset remains a fixed value, it can be compensated for by the use of several well known methods, such as, for example, trimming, offset null adjustments, or DC blocking capacitors. Unfortunately, the DC offset components generated by LO mixing are not fixed and may become time variant when Automatic Gain Control (AGC) is employed to stabilize the gain response of Radio Frequency (RF) amplifier 40 and LO signal 20 leaks into the RF amplifier input 42. Under these circumstances, the LO signal 20 that leaks into the RF amplifier input 42 is subjected to AGC action, thus causing a varying amount of LO signal 20 at the RF input port 32 of the down-mixer 30. This in turn, results in a varying DC offset in the baseband IF signal 110 of Direct Conversion receiver 10.

While fixed DC offset signals in the baseband IF can be compensated for by the techniques suggested herein above, it will be appreciated by those skilled in the art that a varying DC offset signal, which by definition is an Alternating Current (AC) signal, cannot be completely canceled with fixed adjustments alone. It would be extremely advantageous therefore to provide a DC offset compensation circuit that also compensates for varying DC offsets in the baseband IF signal of a radio receiver 10 as a consequence of the before-mentioned LO mixing.

DETAILED DESCRIPTION OF THE PREFERRED EMBODIMENT

Figure 1:
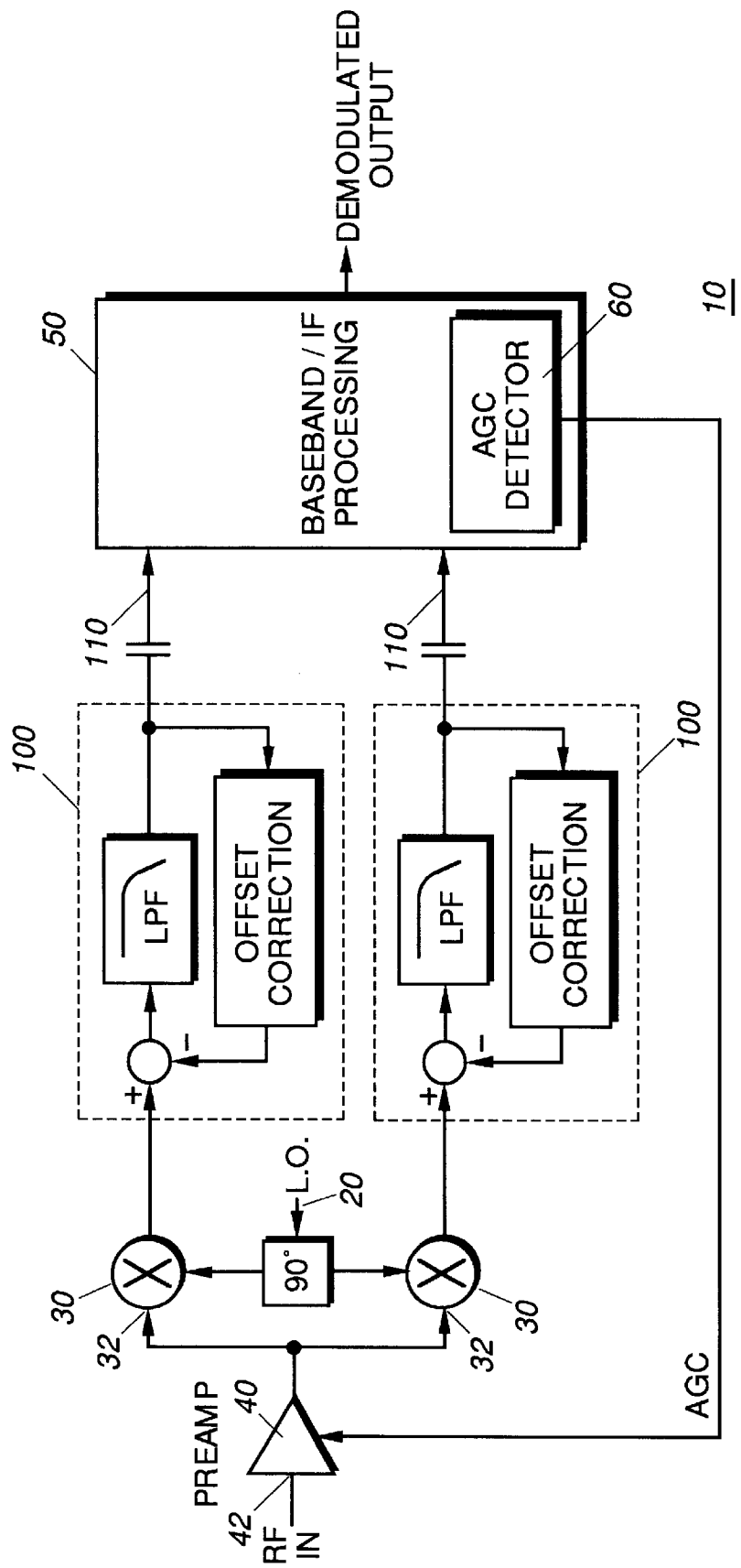
FIG. 1 is a block diagram of a radio receiver having a DC offset compensation circuit as is known in the art.

While the specification concludes with claims defining the features of the invention that are regarded as novel, it is believed that the invention will be better understood from a consideration of the following description in conjunction with the drawing figures, in which like reference numerals are carried forward.

Figure 2:
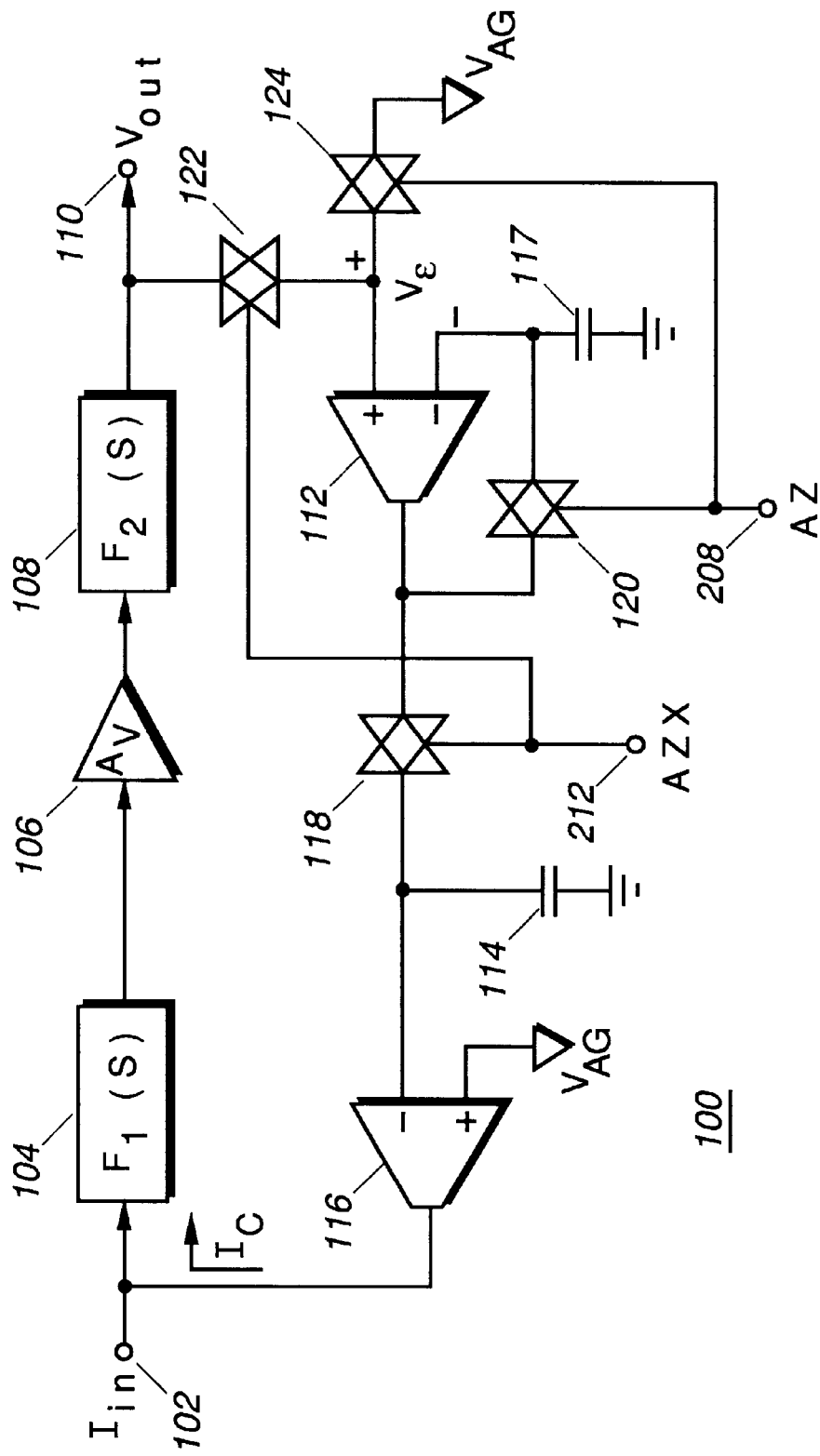
FIG. 2 is a detailed circuit diagram of the DC offset compensation circuit of FIG. 1.

Referring now to FIG. 2, a detailed circuit diagram of the DC offset compensation circuit 100 of FIG. 1 is shown. The circuit 100 includes a forward transmission path and a feedback loop coupled across the forward transmission path. In the preferred embodiment, the forward transmission is a Low Pass Filter (LPF) comprising filters 104 and 108 coupled together via amplifier stage 106. The input to circuit 100 is a signal current $I_{in}$ and the output is a signal voltage $V_{out}$. The use of current input devices eliminates the need for a voltage summer or a combiner at the input 102. The output voltage $V_{out}$ is thereafter compared with a fixed voltage reference (the analog ground voltage, $V_{AG}$) in an error amplifier stage 112. The difference between the output voltage $V_{out}$ and the reference $V_{AG}$, hereinafter referred to as the error signal, is amplified and integrated in the error amplifier 112 and the integrating capacitor 114. In response, a correction current $I_c$ is generated by a second amplifier 116 based upon the integrated error signal. The second amplifier 116 couples the correction current $I_c$ to the input 102 of circuit 100. The integrator 114 provides virtually infinite gain at DC and thus removes any DC offset relative to $V_{AG}$ at the output 110 except for the input offset voltage $V_E$ of the error amplifier 112. The offset correction circuit 100 introduces a first order high pass response in the transfer function of $V_{out}/I_{in}$, which is determined by the loop gain and the value of the integrating capacitor 114. This offset correction technique will maintain the output voltage $V_{out}$ close to the analog ground reference $V_{AG}$, but as indicated above, only to within the input offset of the voltage, $V_E$ of the error amplifier 112. Without additional special techniques, it has proven impractical to obtain offset voltages below a range of 1 mili volts (mV) to 5 mV when the circuit 100 is implemented as an Integrated Circuit (IC).

As is known in the art, however, offset voltages below 1 mV may be achieved when auto-zeroing techniques are utilized. Auto-zeroing implies the error amplifier 112 will be selectively disconnected while the circuit 100 is switched into an auto-zero mode. In accordance with circuit 100, the auto-zero/error amplifier 112 is periodically switched to the auto-zero mode during periods when no input signal $I_{in}$ is being received. The timing for auto-zeroing may be controlled by a microprocessor or other timing circuit. For example, an exhibit control from the radio squelch or signal strength indicator or other means indicating the absence of a signal may be used to trigger the switching to the auto-zero mode. During the auto-zero period, the integrating capacitor 114 is switchably disconnected from amplifier 112 but remains connected to the input of the second amplifier 116 and holds its voltage constant. In this way the required correction current $I_c$ generated by amplifier 116 is held constant during the auto-zero period. When normal mode operation is resumed, the offset correction loop will pick up very close to where it left off when the loop was opened to enter the auto-zero mode. For further discussion on the auto-zero circuit and operation the interested reader may refer to U.S. Pat. No. 5,389,839, Heck, issued Feb. 14, 1995, assigned to the assignee of the present application, and incorporated herein by reference.

Figure 3:
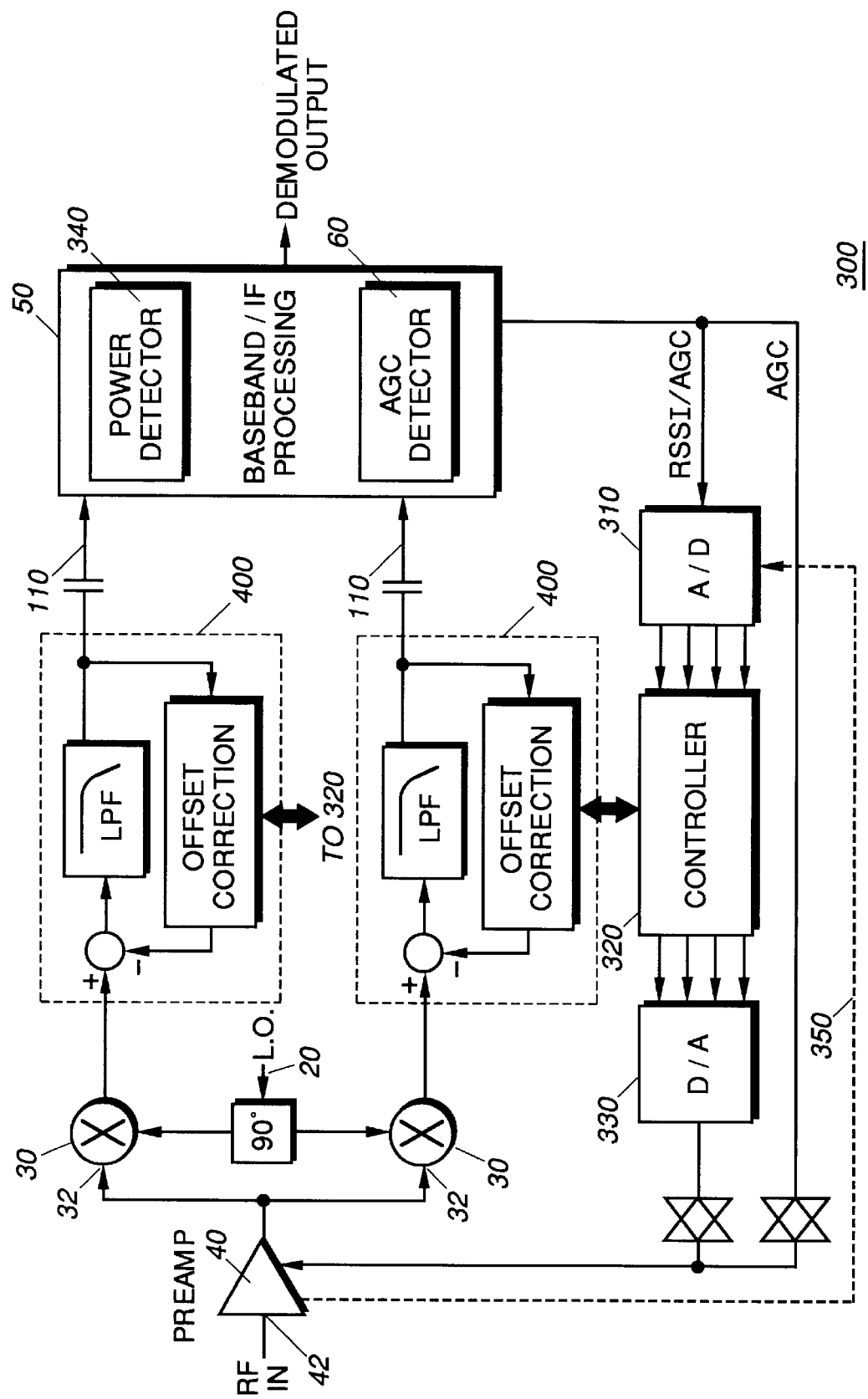
FIG. 3 is a block diagram of a radio receiver having a DC offset compensation circuit in accordance with the present invention.

Referring now to FIG. 3, there is shown a block diagram of a radio receiver 300 employing DC offset compensation in accordance with the present invention. As will be appreciated by those skilled in the art, the receiver 300 of FIG. 3 is similar to the receiver as described in accordance with FIG. 1. This Direct Conversion receiver employs a baseband IF processing circuit 50 which demodulates the baseband IF signal 110. In conjunction with the processing circuit 50, the receiver 300 employs an AGC detector 60. AGC stabilization detection schemes are known in the art and do not require additional discussion at this time. Suffice it to say, however, that it is the adoption of AGC that contributes to the generation of varying DC offset components in the baseband IF signal of receiver 300. As previously stated, these varying DC offset components are generated whenever any LO signal 20 leaks through to the RF amplifier (Preamp) 40 input 42 and is subjected to AGC action. AGC action refers to the process whereby the AGC detector 60 detects rising and falling signal strength levels within the baseband IF and attempts to stabilize these values by increasing or decreasing the gain of Preamp 40. Any LO signal 20 that is subjected to this AGC action, results in varying levels of LO supplied to the mixer circuit 30 and ultimately varying amounts of DC offsets in the baseband IF output 110. Since the varying amounts of DC offset are directly attributable to AGC action, the present invention operates to use the existing offset compensation loop 400 circuitry to correct for that offset attributable to AGC action.

Figure 4:
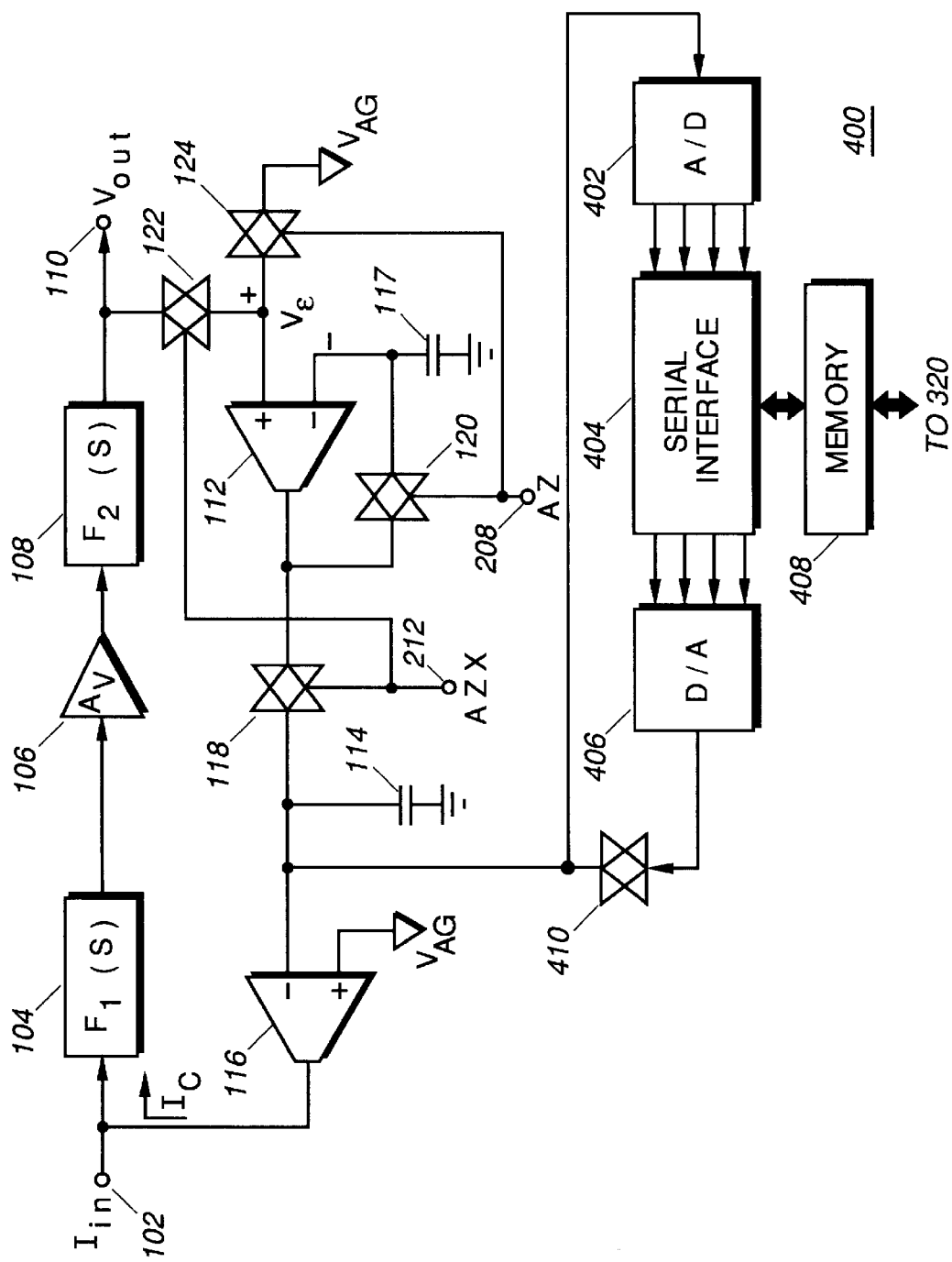
FIG. 4 is a detailed circuit diagram of the DC offset compensation circuit shown in FIG. 3.

Referring now to FIGS. 3 and 4 and taking advantage of the fact that the receiver AGC loop operates independently of the offset compensation loop, the receiver 300 periodically performs a calibration. Such calibration is likely to be performed during initialization when the radio is first turned on. During calibration, the receiver 300 is stimulated with a known input such as, for example, a plurality of gain control signals of varying amplitude. At each of the plurality of gain control signals, each preferably corresponding to a particular signal strength level, the DC offset compensation loop 400 is allowed to stabilize in closed loop mode (i.e., with capacitor 114 switchably connected to the error amplifier 112 output). The corresponding error signal voltage which results at the input to the second amplifier 116 is converted by A/D converter 402 into a digital representation and stored in a storage device such as memory 408. This process is repeated until a complete set of correction voltages have been stored in memory 408. The receiver 300 is then set to operate in normal mode.

In normal mode, when a signal appears on a channel of interest, the AGC loop will respond and stabilize with a gain control output voltage from AGC detector 60. In accordance with the present invention, this gain control voltage is converted by A/D converter 310 to a digital value which is fed to radio controller 320. Radio controller 320 may comprise a microprocessor, microcontroller, or other such well-known control circuit. Radio controller 320 checks this value and looks up a corresponding correction voltage from memory 408 of FIG. 4 as a function of the signal's amplitude. The retrieved correction voltage is then converted by D/A converter 406 to an analog representation corresponding to an error signal voltage. This error signal voltage is applied via switch 410 to second amplifier 116 in order to rapidly establish correction current $I_c$ and charge the integrating capacitor 114. Thereafter, switch 410 is opened, allowing the offset compensation circuit 400 to track any remaining residual offset. It will be appreciated by those skilled in the art that this method of adapting the offset compensation loop's error signal voltage to a level corresponding to a known input signal amplitude such as, for example, AGC, circumvents the lengthy time constant typically associated with offset compensation loop tracking, allows faster attack time, and provides DC offset compensation in response to or as a function of AGC action, all of which are desirable advantages of the present invention.

Figure 5:
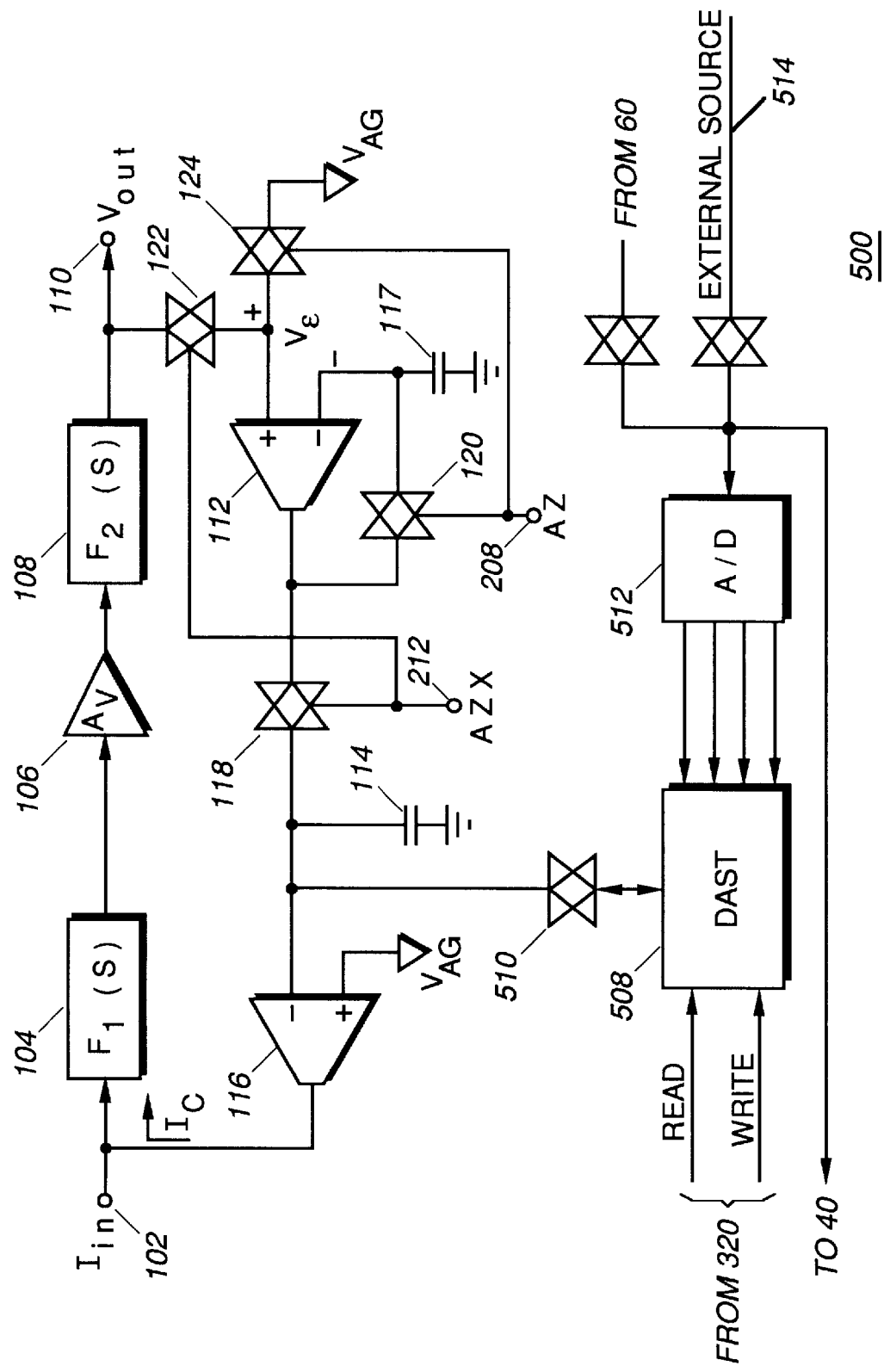
FIG. 5 is a detailed circuit diagram of an alternate embodiment of the DC offset compensation circuit of FIG. 4.

Referring next to FIG. 5, there is shown a detailed circuit diagram of an alternate embodiment of the DC offset compensation circuit of FIG. 4. As will be appreciated, the circuit 500 of FIG. 5 is substantially similar to the circuit 400 described in accordance with FIG. 4, the primary difference being the use of Direct Analog Storage Technology (DAST™) device of 508. DAST device 508 is frequently referred to as analog memory.

Analog memory devices are known in the art, and typically use the same technology as digital memory devices; namely, nonvolatile floating-gate-EE-PROM cells. For digital storage, the floating gate is programmed for strong conductive and nonconductive transistor channels to correspond to strong positive and negative states, respectively. In the alternative, analog memory takes advantage of the intermediate values of conductivity between strongly conductive and nonconductive states to create a nonvolatile analog memory device.

During operation, the circuit 500 will be calibrated in accordance with the description of circuit 400, with either gain control signals being applied from an external source 514 or from an internal controller source, such as controller 320, D/A converter 330, and associated switches of FIG. 3. It will be appreciated by those skilled in the art that such calibration may also be achieved by stimulating any forward transmission path stage with a plurality of input signals of known and varying amplitude. Once the offset correction (error signal) voltage stabilizes for each of the known input signal levels, its analog value is stored in DAST 508 as a function of the input signal amplitude. This process is repeated until a complete list of correction voltages have been stored in memory 508. Upon completion, the receiver is set to operate in the normal mode. Of note, if a control signal is made available, the stored values can be updated automatically to compensate for environmental conditions such as, for example, temperature.

Assuming signal strength, as opposed to gain control signal, is utilized as the input signal of interest, receiver 300 will utilize power detector 340 to detect the signal strength of the received signal (RSSI). This signal is converted by A/D converter 310 to a digital value which is fed to radio controller 320 in order to look up a corresponding correction voltage stored in memory. Optionally, if stage (e.g., Preamp 40) gain is utilized as the signal based upon which offset correction error signals are stored in memory, then receiver 300 will provide information 350 corresponding to stage gain, such as, for example, current draw or power draw, to A/D 310.

In normal mode, when a signal appears on the channel, the AGC loop will respond and attempt to stabilize with a gain control voltage from AGC detector 60. In accordance with the present invention, the gain control signal is converted by A/D converter 512 to a digital value which is fed to DAST 508 in order to address the corresponding gain control signal stored therein. The retrieved and converted signal is then applied via switch 510 to the second amplifier 116 in order to establish correction current $I_c$ and charge integrated capacitor 114.

It will be appreciated by those skilled in the art that this method of driving the offset compensation loop error signal voltage and conversely, the current $I_c$ to a level corresponding to a known input signal amplitude such as, for example, AGC or signal strength, circumvents the lengthy time constant normally associated with offset compensation loop tracking, allows faster attack time, and provides a DC offset compensation in response to or as a function of AGC action, all of which are desirable advantages of the present invention.

Figure 6:
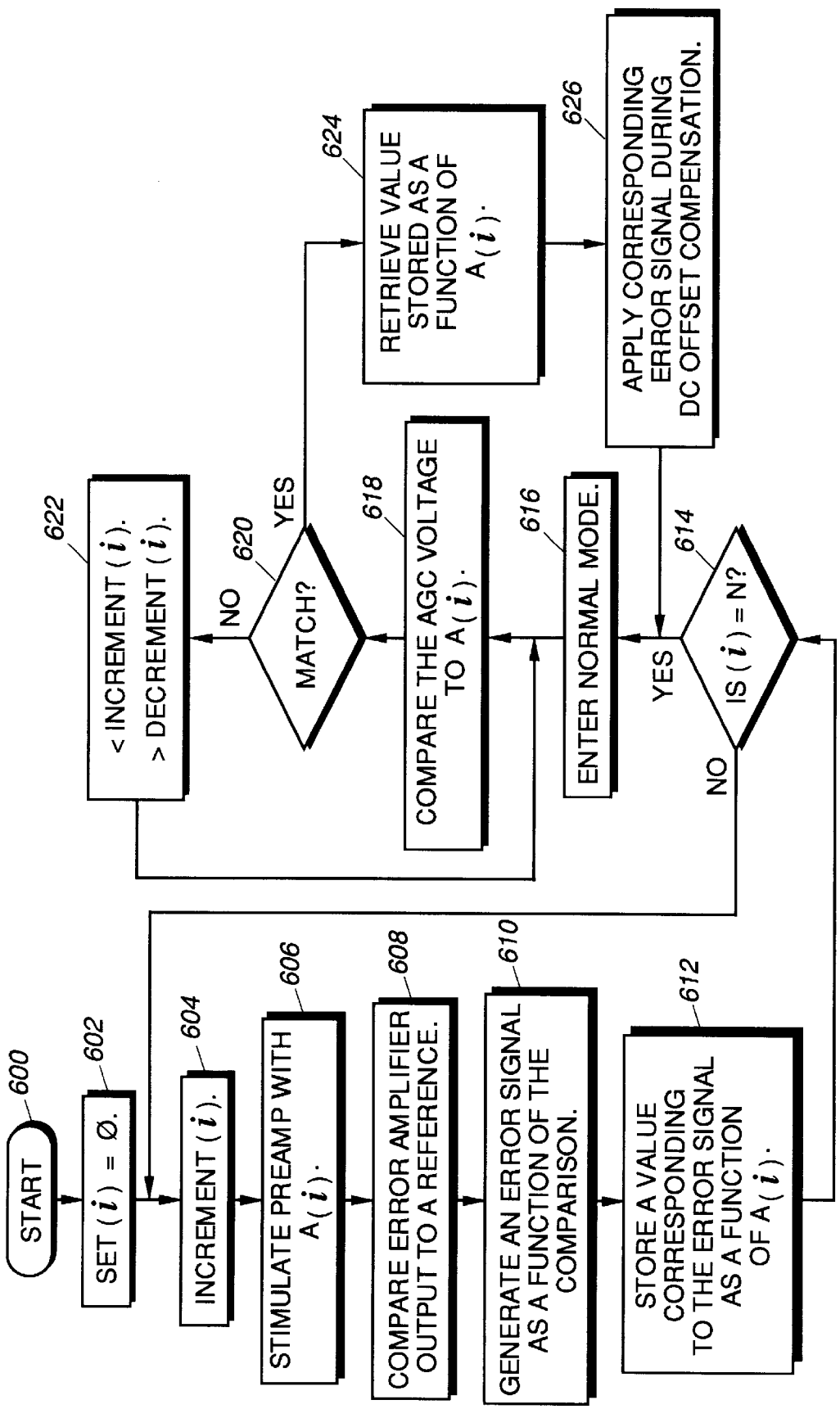
FIG. 6 is a flow chart diagram setting forth the process of DC offset compensation in accordance with the present invention.

Referring next to FIG. 6, there is shown a flow chart diagram of the steps performed by radio receiver 300 of FIG. 3, under the direction and control of controller 320 in order to perform DC offset compensation in accordance with the present invention. Commencing at start block 600, the receiver 300 initiates a calibration routine. In accordance, flow chart proceeds to block 602 where a register, like those normally used in association with a controller, such as controller 320, is initialized (e.g., (i) is set to zero). From block 602, flow proceeds to block 604 where the register value is incremented. At block 606, Preamp 40 is stimulated with a known signal, such as, for example, a gain control signal or RF input signal. In accordance with the preferred embodiment, A(i) is a signal of incremental amplitude and may be defined as A(i)=i/N where "N" is the number of amplitude variations anticipated. At block 608, the Preamp 40 output is compared to a reference by error amplifier 112. At block 610, error amplifier 112 generates an error signal as a function of the comparison. From block 610, flow proceeds to block 612 where a value corresponding to the error signal is stored in memory as a function of the known signal A(i). It will be appreciated by those skilled in the art that the present invention anticipates storing values in memory as a function of the input signal amplitude, such input signals to include, but are not limited to, RF signal strength and gain control signals.

From block 612, flow proceeds to block 614, where a check is performed to determine whether the process of error signal storage is complete. If not, flow branches back to block 604 where the process continues until a complete list of correction voltages are stored in memory. From block 614, flow proceeds to block 616 where the receiver enters the normal mode of operation. During normal mode, when a signal appears on the channel, the AGC loop will respond with a gain control signal from AGC detector 60. At blocks 618–622, controller 320 will compare the signal from AGC detector 60 to the set of known signals A(i) used to store error signals in memory. When a match or near match is found, flow will proceed from block 620 to block 624 where the controller will retrieve the appropriate error voltage from memory. Thereafter, the retrieved value is converted by D/A converter 400 to an analog signal for application to second amplifier 116. By near match, the applicants anticipate that values within some defined threshold shall be considered a match. For the purposes of the present invention, values that compare within 0.2 volts are deemed a match.

As will be appreciated, this method of adapting, driving, or forcing the offset compensation loop error signal voltage and conversely, the correction current $I_c$ to a level corresponding to a known AGC or signal strength level circumvents the otherwise lengthy time constant typically associated with offset compensation loop tracking, allows faster attack times, provides a DC offset comparison in response to or as a function of a known input signal amplitude; and forces the Preamp 40 output to more accurately follow a desired DC voltage, which, in turn, operates to reduce the amount of varying DC offsets in the baseband signal of radio receiver 300.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. A receiver having an electronic circuit, the circuit comprising:

a forward transmission path having at least one gain stage for receiving an input signal and providing an output, said input signal having an amplitude, said gain stage responsive to receive a gain control signal;

a feedback path coupled into the forward transmission path and having an error amplifier for generating an error signal in response to receipt of the input signal;

a memory device coupled to the feedback path for storing a set of predetermined correction signals as a function of the gain control signal; and a control circuit, coupled to the memory device and responsive to the gain control signal for retrieving a correction signal from the memory device for input into the feedback path to force the feedback path voltage to accurately follow a desired DC voltage.

2. A communications device having a receiver, said receiver comprising:

an amplifier having a signal input, a gain control signal input, and an output;

a down-mixing circuit, coupled to the amplifier and fed by a reference frequency;

an offset compensation circuit coupled to the down-mixing circuit comprising:

a forward transmission path for feeding a down-mixed amplifier output forward, said down-mixed amplifier output having an amplitude; and a feedback path coupled into the forward transmission path and having an error amplifier for generating an error signal in response to a difference between the down-mixed amplifier output and a voltage reference;

a memory device coupled to the feedback path for storing a set of predetermined correction voltages as a function of gain control signal amplitude;

a control circuit, coupled to the memory device and responsive to the gain control signal for retrieving a correction voltage from the memory device for input into the feedback path to force the feedback path voltage to accurately follow a desired DC voltage; and a detector, coupled to the amplifier, and the control circuit for detecting the gain control signal amplitude.

3. A method for providing DC offset compensation in a receiver having an offset correction loop comprising the steps of:

stimulating an amplifier with a gain control signal of known amplitude to generate an output;

comparing the output to a reference to generate an error signal;

storing a correction signal value in memory as a function of the gain control signal of known amplitude;

detecting a signal applied to the amplifier;

comparing the detected signal with the gain control signal of known amplitude;

retrieving the correction signal value from memory when the detected signal and the gain control signal of known amplitude compare; and applying the retrieved correction signal value to the offset compensation loop to preset a loop voltage level.

4. The method of claim 3, further comprising the steps of:

stimulating the amplifier with a plurality of gain control signals of known and varying amplitudes to generate a plurality of outputs;

comparing each output to the reference to generate a plurality of error signals;

storing correction signal values in memory as a function of the corresponding gain control signal of known amplitude.

5. A method for providing DC offset compensation in a receiver having an offset compensation loop comprising the steps of:

stimulating an amplifier with a gain control signal of known amplitude to generate an output;

comparing the output to a reference to generate an error signal;

storing a correction signal value in memory as a function of the gain control signal amplitude; thereafter, detecting a gain control signal applied to the amplifier;

comparing the amplitude of the detected gain control signal with the amplitude of the gain control signal of known amplitude;

retrieving the correction signal value from memory when the amplitudes compare; and applying the retrieved correction signal value to the offset compensation loop to preset a loop voltage value.

\* \* \* \* \*